United States Patent
Torng et al.

(10) Patent No.: US 10,672,455 B2
(45) Date of Patent: *Jun. 2, 2020

(54) METHOD OF SELF-TESTING AND REUSING OF REFERENCE CELLS IN A MEMORY ARCHITECTURE

(71) Applicant: Gyrfalcon Technology Inc., Milpitas, CA (US)

(72) Inventors: Chyu-Jiuh Torng, Dublin, CA (US); Lin Yang, Milpitas, CA (US); Qi Dong, San Jose, CA (US); Daniel H. Liu, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,701

(22) Filed: May 7, 2019

(65) Prior Publication Data

US 2019/0267072 A1    Aug. 29, 2019

Related U.S. Application Data

(63) Continuation of application No. 15/726,084, filed on Oct. 5, 2017, now Pat. No. 10,347,317.

(51) Int. Cl.
*G11C 11/4078* (2006.01)
*G11C 11/02* (2006.01)
(Continued)

(52) U.S. Cl.
CPC .......... *G11C 11/4078* (2013.01); *G06N 20/00* (2019.01); *G11C 11/02* (2013.01);
(Continued)

(58) Field of Classification Search
CPC ................... G11C 11/4078; G06N 20/00
(Continued)

(56) References Cited

U.S. PATENT DOCUMENTS

| | | |
|---|---|---|
| 6,396,742 B1 | 5/2002 | Korsh et al. |
| 7,020,022 B1 | 3/2006 | Wang et al. |

(Continued)

FOREIGN PATENT DOCUMENTS

JP    2004-171730 A    6/2004

OTHER PUBLICATIONS

Benso, A. et al., "An On-Line BIST RAM Architecture with Self Repair Capabilities," IEEE Transactions on Reliability, vol. 51, No. 1, Mar. 2002.*

(Continued)

*Primary Examiner* — Huan Hoang
*Assistant Examiner* — Muna A Techane
(74) *Attorney, Agent, or Firm* — Brinks Gilson & Lione

(57) ABSTRACT

An integrated circuit includes an artificial intelligence (AI) logic and an embedded memory coupled to the AI logic and connectable to an external processor. The embedded memory includes multiple storage cells and multiple reference units. One or more reference units in the memory are selected for memory access through configuration at chip packaging level by the external processor. The external processor may execute a self-test process to select or update the one or more reference units for memory access so that the error rate of memory is below a threshold. The self-test process may be performed, via a memory initialization controller in the memory, to test and reuse the reference cells in the memory at chip level. The embedded memory may be a STT-MRAM, SOT, OST MRAM, and/or MeRAM memory.

20 Claims, 3 Drawing Sheets

(51) Int. Cl.
*G06N 20/00* (2019.01)
*G11C 29/02* (2006.01)
*G11C 29/08* (2006.01)
*G11C 29/24* (2006.01)
*G06N 3/04* (2006.01)
*G11C 29/46* (2006.01)
*G11C 29/04* (2006.01)
*G11C 29/12* (2006.01)
*G11C 29/44* (2006.01)

(52) U.S. Cl.
CPC ............ *G11C 29/028* (2013.01); *G11C 29/08* (2013.01); *G11C 29/24* (2013.01); *G06N 3/0454* (2013.01); *G11C 29/46* (2013.01); *G11C 2029/0401* (2013.01); *G11C 2029/1206* (2013.01); *G11C 2029/4402* (2013.01)

(58) Field of Classification Search
USPC ......................................................... 365/158
See application file for complete search history.

(56) References Cited

U.S. PATENT DOCUMENTS

| | | |
|---|---|---|
| 7,773,413 B2 | 8/2010 | Shalvi |
| 8,488,357 B2 | 7/2013 | Sunaga et al. |
| 9,104,815 B1 | 8/2015 | Cohen et al. |
| 10,347,317 B2 * | 7/2019 | Torng .................. G11C 11/4078 |
| 2004/0136236 A1 | 7/2004 | Cohen |
| 2004/0218440 A1 | 11/2004 | Kumar et al. |
| 2015/0092469 A1 * | 4/2015 | Kim .................... G11C 11/1673 365/148 |
| 2015/0187440 A1 | 7/2015 | Hollis |
| 2017/0186472 A1 | 6/2017 | Jan et al. |
| 2018/0143762 A1 * | 5/2018 | Kim .................... G11C 16/3431 |

OTHER PUBLICATIONS

Na, T. et al., "Reference-Scheme Study and Novel Reference Scheme for Deep Submicrometer STT-RAM," IEEE Transactions on Circuits and Systems, vol. 61, No. 12, Dec. 2014.*
[Communication] European Extended Search Report dated Feb. 21, 2019 for EP Application No. EP 1819873535 (9 pp.).

* cited by examiner

METHOD OF SELF-TESTING AND REUSING OF REFERENCE CELLS IN A MEMORY ARCHITECTURE

CROSS REFERENCE

This patent application is a continuation of and claims priority to U.S. patent application Ser. No. 15/726,084, filed on Oct. 5, 2017 and entitled "Method of Self-Testing and Reusing of Reference ells in a Memory Architecture", which is incorporated herein by reference in its entirety.

BACKGROUND

This patent document relates generally to the self-testing of memory, and in particular to self-testing and reusing of reference cells in a memory architecture, such as an embedded MRAM memory in an artificial intelligence chip.

Memory is an important component in an artificial intelligence (AI) chip that has low power and high performance characteristics as each AI engine is usually comprised of multiple memory components. Conventional tests for memories such as, static random access memory (SRAM) or magnetoresistive random access memory (MRAM), typically use built-in self-test/repair (BIST/R) methods to perform memory bit quality verification and repair functions. For example, Benso et al. propose a built-in self-repair (BISR) structure for RAM cores. See Benso, Chiusano, Di Natale and Prinetto, "An On-Line BIST RAM Architecture with Self-Repair Capabilities," IEEE Transactions on Reliability, Vol 51, No. 1, March 2002. BIST/R methods are usually performed at wafer level, which requires critical path of content addressable memory (CAM), controller, register array and proper encoding logic inside the chip. This approach takes much space inside the chip as it requires the insertion of redundant columns/rows/cell arrays and architectural structures.

In an MRAM memory architecture, self-testing is traditionally performed using reference cells built inside the memory architecture to ensure sensing margin due to process voltage temperature (PVT) change such that the stored information of 0 and 1 can be sensed well. For example, Na et al. describe three types of reference cells/units in a spin transfer torque (STT)-RAM architecture: reference column, reference row and reference array. See Na, Kim, Kim, Kang and Jung, "Reference-Scheme Study and Novel Reference Scheme for Deep Submicrometer STT-RAM," IEEE Transactions on Circuits and Systems, Vol. 61, No. 12, December 2014. The reference cells in an MRAM memory are generally used in the reading process, in which the resistances of the storage cells will be measured and compared to those of the reference cells to decide whether a '1' or '0' is stored in each of the storage cells correctly. Reference cells can be built just like storage cells, but are preset or programmed at known states, such as 1's or 0's. Reference cells can be programmed at the factory test stage. A memory self-test that uses reference cells needs to take into account which reference cell unit, such as a reference row, reference column or reference array, is bad. If reference columns are used, and if one or more cells in a reference column are bad, that reference column will be replaced by a redundant column. This approach often requires more redundant reference cells in order to achieve better chip performance. However, this increases the chip size. Testing may be done at either wafer or chip packaging level or both. Like conventional testing in a memory, reference cells cannot be altered once the chip is fabricated.

As described above, existing approaches are particularly of challenge when applied to a low power and high performance AI chip with embedded MRAM memory that has large memory bits but requires small chip size. This challenge becomes critically important when designing an AI chip for mobile devices. Further, redundant cells as with conventional BIST/R processes or reference cells in an MRAM memory are fixed and cannot be changed or reused once the chip is fabricated. Furthermore, self-testing is usually done at wafer level and can be time consuming.

SUMMARY

An integrated circuit includes an artificial intelligence (AI) logic and an embedded memory coupled to the AI logic and connectable to an external processor. The embedded memory is a MRAM memory and includes multiple storage cells and multiple reference units. A reference unit may be a reference column, a reference row or a reference array. One or more reference units in the memory are selected for memory access through configuration at chip packaging level by the external processor. The external processor may be the AI logic in the integrated circuit or an external computing device.

In selecting the reference units in the memory, the external processor may perform the steps of: (i) determining a number of reference units from the plurality of reference units according to a pattern to form a set of reference cells, wherein the pattern defines which reference unit in the plurality of reference units is to be selected; (ii) programming a subset of the set of reference cells with a value of zero and a remaining subset of the set of reference cells with a value of one; (iii) using the set of reference cells to test the plurality of storage cells in the memory to determine an error rate; (iv) determining whether the error rate exceeds an error threshold; and (v) upon determining that the error rate of the plurality of storage cells in the memory exceeds the error threshold, updating the pattern, updating the set of reference cells by selecting a number of reference units from the plurality of reference units according to the updated pattern, and repeating the steps of (ii)-(v). If the error rate does not exceed the error threshold, the external processor may set the set of reference cells as selected reference cells, and store reference cell information indicative of which cell in the set of reference cells has a value of zero and which has a value of one.

The error threshold is defined by an artificial intelligence application that executes in the AI logic of the integrated circuit. The memory may be a MRAM memory (e.g., a STT-MRAM memory) and may store a cellular neural network (CNN) for executing the artificial intelligence application. In testing the plurality of storage cells the external processor may write a value of one to the plurality of storage cells and compare each of the plurality of storage cells with one or more reference cells to determine a first error rate. The external processor may also write a value of zero to the plurality of storage cells and compare each of the plurality of storage cells with one or more reference cells to determine a second error rate, and determine the error rate by adding the first error rate and the second error rate.

The integrated circuit may also have a memory initialization controller configured to cause the external processor to perform a self-test and reuse the reference cells in the memory, such as during the boot-up of the memory.

A self-test process using the above described integrated circuit may include: (i) determining a number of reference units from the plurality of reference units according to a pattern to form a set of reference cells, wherein the pattern defines which reference unit in the plurality of reference units is to be selected; (ii) programming a subset of the set of reference cells with a value of zero and a remaining subset of the set of reference cells with a value of one; (iii) using the set of reference cells to test the plurality of storage cells in the MRAM memory to determine an error rate; (iv) determining whether the error rate exceeds an error threshold; and (v) upon determining that the error rate of the plurality of storage cells in the MRAM memory exceeds the error threshold: updating the pattern, updating the set of reference cells by selecting a number of reference units from the plurality of reference units according to the updated pattern, and repeating the steps of (ii)-(v). If the error rate does not exceed the error threshold, the self-test process may set the set of reference cells as selected reference cells, and store reference cell information indicative of which cell in the set of reference cells has a value of zero and which has a value of one.

In programming the subset and the remaining subset of the set of reference cells, the self-test process may randomly store a value of zero or one in each of the set of reference cells so that the subset contains approximately half of the set of reference cells.

The self-test process may be repeated any time during the use life of the integrated circuit to reuse the reference cells by: (i) using the reference cell information to program a subset of the set of reference cells with a value of zero and a remaining subset of the set of reference cells with a value of one; (ii) using the set of reference cells to test the plurality of storage cells in the memory to determine an error rate; (iii) determining whether the error rate exceeds an error threshold; and (iv) upon determining that the error rate of the plurality of storage cells in the memory exceeds the error threshold: updating the pattern that was used to form the set of reference cells; updating the set of reference cells by selecting a number of reference units from the plurality of reference units according to the updated pattern; and setting the set of reference cells as selected reference cells.

DETAILED DESCRIPTION

Figure 1:
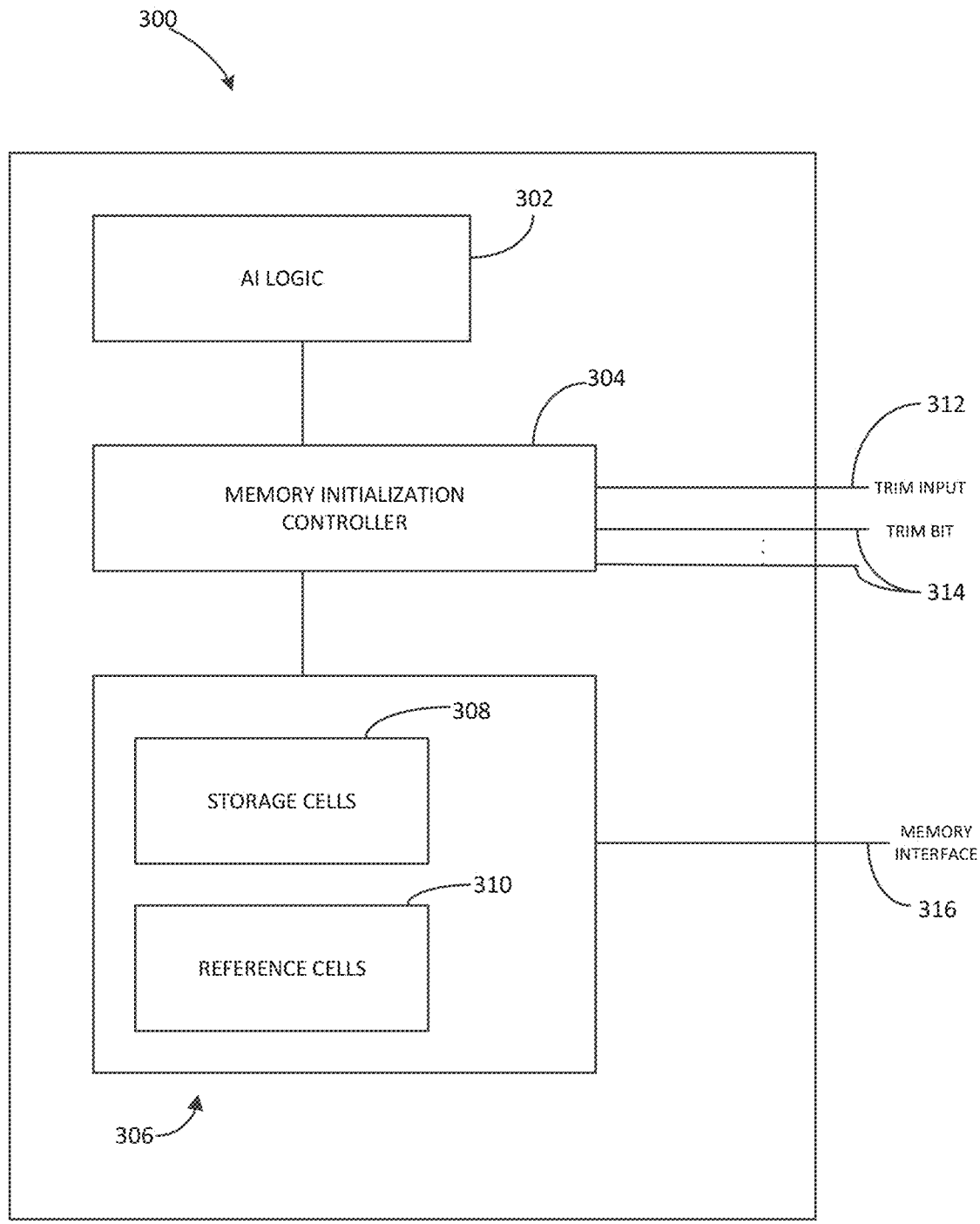
FIG. 1 shows an example of a diagram of an AI chip with embedded memory having self-test capabilities according to some embodiments.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

Furthermore, the described features, advantages and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to." Unless defined otherwise, all technical and scientific terms used in this document have the same meanings as commonly understood by one of ordinary skill in the art.

Each of the terms "artificial intelligence logic" and "AI logic" refers to a logic circuit that is configured to execute certain AI functions such as a neural network in AI or machine learning tasks. An AI logic can be a processor. An AI logic can also be a logic circuit that is controlled by an external processor and execute certain AI functions.

The term "wafer level" for the purpose of testing an integrated circuit (i.e. the semiconductor chip) refers to testing the semiconductor chip while the chip is still in wafer form. Wafer level testing is generally performed at foundries at the time of manufacturing.

Each of the terms "chip packaging level" or "chip level" for the purpose of testing an integrated circuit (i.e. the semiconductor chip) refers to testing the semiconductor chip while the chip is already packaged. Chip level testing can be performed at foundries or at a user site after the chip has been manufactured.

With reference to FIG. 1, an AI integrated circuit (IC), i.e. an AI chip 100 includes an AI logic 102 and embedded memory 106. The embedded memory 106 may include MRAM, such as, for example, STT-MRAM, spin orbit torque (SOT), orthogonal spin transfer (OST) MRAM, magnetoelectric RAM (MeRAM), or a combination thereof. The embedded memory 106 contains multiple storage cells 108. The embedded memory 106 also contains multiple reference cells 110 that provide a reference voltage or current for testing storage cells. The embedded memory 106 is coupled (e.g., directly or indirectly connected) to the AI logic for storing data that is needed for the AI logic to perform computations, such as implementing machine learning or neural network algorithms in AI applications.

In some or other scenarios, the embedded memory 106 may also be connectable to an external processor, via one or more pins such as MRAM interface 116, to allow the external processor to access any of the storage cells 108 or reference cells 110 in the memory. This allows one or more of the reference cells 110 to be selected for normal memory access via a self-test process that can be performed at chip packaging level, which will be explained in detail later. The external processor may be an external computing device. The external processor may also be the AI logic 102. A portion of the reference cells 110 may be selected through configuration at chip packaging level by the external processor.

The self-test process may determine an initial set of reference cells from all of the reference cells 110 and use the initial set to measure the error rate of the embedded memory and determine whether the error rate exceeds a threshold. If the error rate is below the threshold, the self-test process stops and the initial set of reference cells may be used for normal memory access. If the error rate reaches or exceeds the threshold, the self-test process may continue by selecting a different set of reference cells among all of the reference cells 110, using the different set of reference cells to measure the error rate of the memory, and/or repeating the same process until the error rate is below the threshold. Such self-test process uses a statistical approach to achieve a target error rate that is acceptable to the AI applications. For example, the threshold for the error rate may be 1-2%. In other words, a memory with 1-2% error rate will not affect the use of the memory for some AI applications. This "lenient" criteria for the error rate of memory increases the utilization of the memory and reduces the waste in memory fabrication due to imperfect yield rate.

The self-test process is preferably invoked at chip packaging level via an external processor. The self-test process may also be invoked at wafer level. With further reference to FIG. 1, the AI chip 100 may further include a memory initialization controller 104 that is connected to the embedded memory 106. The memory initialization controller 104 may have one or more trim bits 114 and one or more trim input 112, and configured to invoke a self-test of the memory. For example, the memory initialization controller 104 may be configured to receive timing signals at the trim bits 114, receive data signals at the trim input 112. The trim input 112 may have multiple bits that correspond to a portion of the reference cells 110. In response to receiving the timing signals, the memory initialization controller 104 may be configured to latch the data signals to at least a portion of the storage cells 108 and/or a portion of the reference cells 110 to which the one or more trim input bits correspond. The memory initialization controller 104 may be enabled to invoke the self-test process during various stages of the IC chip, such as during fabrication (at wafer level or packaging level) or chip level. In a non-limiting example, when the AI chip is initialized during the system boot-up, the memory initialization controller 104 may be configured to start the self-test process on the embedded memory 106 and select the set of reference cells in that the error rate of the memory meets the threshold.

Figure 2:
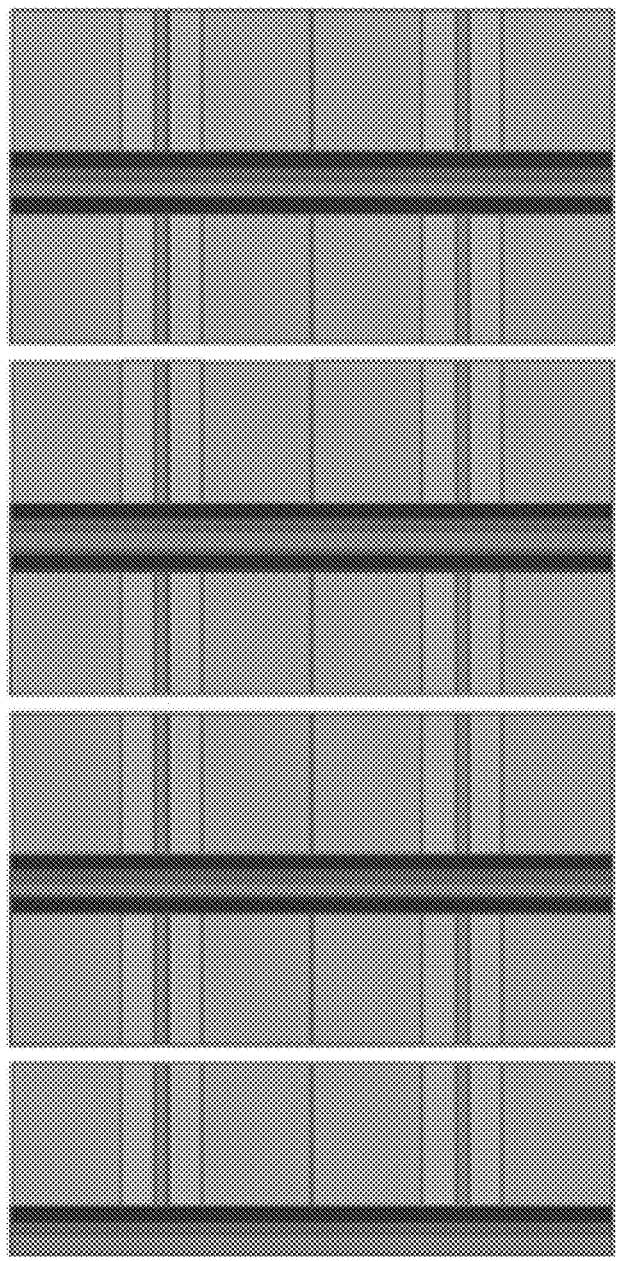
FIG. 2 shows an example of an embedded MRAM memory having reference cells according to some embodiments.

The self-test process described above changes or updates the selection of reference cells each time it performs the test. This approach applies to any suitable reference cell structures, such as those illustrated in FIG. 2, in that the reference cell can be in a row, column or array structure. In a non-limiting example, FIG. 2 shows a memory structure 200 that has multiple reference cell columns 210. Memory structure 200 may have multiple memory cells 208, x-decoder lines 204, y-decoder lines 202 and memory address (SA) lines 206. The reference cells may have a number of columns, for example, 20 columns. The above illustrated self-test process aims to select a smallest subset of available reference columns that are sufficient to meet the error rate criteria.

Figure 3:
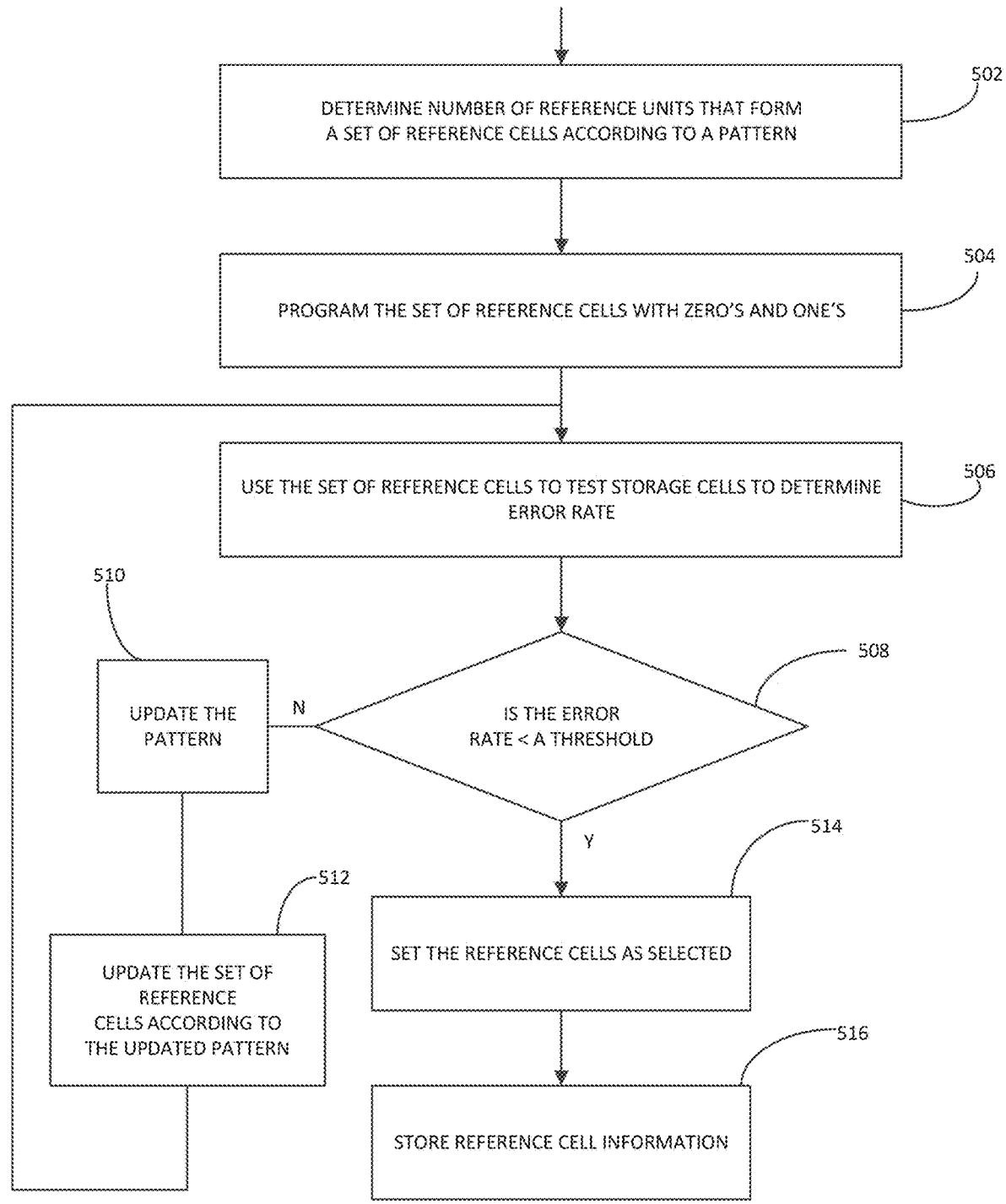
FIG. 3 shows an example of a diagram of a self-test process according to some embodiments.

With reference to FIG. 3, the self-test process is further explained in detail. A memory may have multiple reference units (e.g., N columns). The self-test process may include determining a number of reference units (X) from the plurality of reference units (N) according to a pattern 302 to form a set of reference cells. The pattern defines which reference unit in the plurality of reference units is to be selected (X<=N). For example, the reference cells that are in a column structure may have a total of N=20 columns (reference units), and the number of reference units is initially set to X=16. This number may be empirically set, and may change during the test. A pattern may also be predetermined, for example, columns 1-16 may be initialized determined for a memory that has 20 reference columns. According to this pattern, the process may form a set of reference cells that include the first 16 columns of reference cells.

The self-test process further includes programming the set of reference cells with zero's and one's 304. For example, the process may program a subset of the set of reference cells with a value of zero and the remaining subset of the set of reference cells with a value of one. In some scenarios, the process may randomly store a value of zero or one in each of the set of reference cells so that the set of reference of cells contain approximately equal number of zero and one cells.

The process further includes using the set of reference cells to test the storage cells in the memory to determine an error rate 306. In doing so, the process may write a value of one to all of the storage cells in the memory and compare the voltage or current of each storage cell with that of one or more reference cells to determine whether each of the storage cells has correctly stored data. The process may determine the number of storage cells that have errors and determine a first error rate by dividing the number of bad storage cells (i.e. those having errors) by the total number of storage cells. In a similar manner, the process may write a value of zero to all of the storage cells and determine a second error rate. The process may further determine the error rate of the memory by adding the first error rate and the second error rate.

The self-test process further includes comparing the error rate with an error threshold and determining whether the error rate exceeds the error threshold 308. The error threshold may be defined by an AI application that is to be executed in the AI chip and the embedded memory. For example, the MRAM memory may store a convolution neural network for executing the AI application. Whereas an AI application may not need to achieve 100% accuracy, it may also tolerate small errors in the memory. For example, a memory error threshold of 1-2% may be acceptable for some AI applications. A lower or high error threshold may also be pre-defined depending on the AI applications that are to be executed in the AI chip. In a manufacturing process in which the yield is high, the error threshold may be easily satisfied in the test.

Upon determining that the error rate of the storage cells in the memory is below the error threshold, the process may set the current set of reference cells as selected reference cells 314, and store reference cell information 316 indicative of which cell in the set of reference cells has a value of zero and which has a value of one, and stop. This reference cell information records the locations (addresses) of good reference cells that can be saved for future use. The reference cell information may be saved inside the memory array, such as, in info cells of the memory, or outside the memory array, such as in an electronically programmed fuse (eFuse).

Upon determining that the error rate of the storage cells in the memory is above the error threshold, the process may further include updating the pattern 310 (so that different reference cells can be selected), updating the set of reference cells by selecting a number of reference units from the plurality of reference units according to the updated pattern 312, and repeating above steps of 304, 306, 308.

In updating the pattern 310, the process may use a different pattern in each round of the test. In some scenarios, the process may shift a previous pattern by one or more reference units so that the updated pattern and the previous pattern contain identical number of reference units. For example, the previous pattern may be defined as columns 1-16, and each time the updated pattern may be shifted one column from the previous one, such as columns 2-17 or 3-18 etc. Alternatively, the process may decrease one or more reference units (e.g., reference columns) from the previous pattern or select new reference units to derive the updated pattern. For example, the previous pattern may be defined as columns 1-16, and the updated pattern may be defined as columns 1-15, 2-16, or 17-18. Alternatively, the process may also increase one or more reference units from the previous pattern, such as changing columns 1-16 to columns 1-18. The step of updating the pattern may not be limited to any particular way.

As described above with reference to FIG. 1, the self-test process may further include invoking the test via a memory initialization controller in the AI chip, and the self-test step may be performed at any time at chip level and repeated during the use life of the chip. For example, after a memory chip has been used for some time, one or more of the reference cells may become bad. The memory may be re-initialized via the memory initialization controller. The same self-test process may be repeated at chip level to determine whether the error rate of the memory has exceeded the threshold that is acceptable to the applications running in the AI chip, and if so, may select or reuse another set of reference cells and repeat the same self-test process described above with an updated set of reference cells.

In reusing the reference cells, the process may include: using the previously stored reference cell information about the set of reference cells to program a subset of the set of reference cells with a value of zero and a remaining subset of the set of reference cells with a value of one; using the set of reference cells to test the plurality of storage cells in the memory to determine an error rate; determining whether the error rate exceeds an error threshold; and upon determining that the error rate has exceeded the error threshold, updating the reference cells. In some scenarios, the process may update the reference cells by: updating the pattern that was used to form the set of reference cells; updating the set of reference cells by selecting a number of reference units from the plurality of reference units according to the updated pattern, and setting the set of reference cells as selected reference cells.

The illustrated solution allows re-use of the reference cells that were not selected initially, and thus can avoid abandonment of the chip due to bad cells. In another non-limiting example, in case the application of the AI chip changes in that the new application requires a more stringent error rate, the same self-test process may be repeated as described above, to ensure that the error rate of the memory meets the new application.

The various structures and methods disclosed in this patent document provide advantages over the prior art, whether standalone or combined. The above illustrated memory and self-test methods use a statistical methodology to check reference cells to determine lowest error count of working cells (i.e., storage cells) and can reuse bits in the reference cells in future tests. The above illustrated self-test process uses a software approach such that none or few circuits are required as in the conventional BIST/R methods, which are usually performed at wafer level. Further, because the self-test process can be re-initiated by an external processor (e.g., the AI logic or external computing device), all of the steps may be performed at chip packaging level. Thus, the circuits associated with conventional BIST/R methods can be reduced/eliminated to gain circuit advantages. Further, the above illustrated memory and process allow a quicker way to check reference cells and storage cells as opposed to how the memory test is usually done at wafer level.

Since the above illustrated methods use a software methodology, they are flexible and can adapt to various applications. For example, the self-test process can use various patterns in selecting and reusing the reference cells. This can help use the lowest number of reference cells while meeting the error threshold, and avoid excessive use of reference or memory cell data redundancy thus decreasing overhead capacities. In return, a smaller chip size can be achieved, which is particularly advantageous for mobile smart applications. Further, the re-initialization and chip-level testing capability allow the present solution to reuse good bits of reference cells without using the conventional BIS T/R methods.

Other advantages can be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes, modifications, and all combinations of various embodiments that are within the scope and spirit of the invention as defined in the claims.

The invention claimed is:

1. A method for memory access, comprising:
   automatically selecting from a pool of reference memory cells of a memory chip a first subset of reference memory cells;
   writing a set of reference data into the first subset of reference memory cells;
   measuring a memory access error rate (MAER) for a set of storage memory cells of the memory chip in reference to the first subset of reference memory cells stored with the set of reference data;
   determining a first MAER threshold for operating a first artificial intelligence (AI) model with an acceptable accuracy;
   determining whether the measured MAER is below the first MAER threshold;
   when the measured MAER is below the first MAER threshold, loading the first AI model into the set of storage memory cells and configuring the first subset of reference memory cells with the set of reference data for subsequent operation of the first AI model; and when the measured MAER is not below the first MAER threshold, starting a process for automatically selecting a second subset of reference memory cells from the pool of reference memory cells for use with the first AI model.

2. The method of claim 1, wherein the pool of reference memory cells and the set of storage memory cells comprise magnetic random access memory (MRAM) cells.

3. The method of claim 2, wherein each of the MRAM cells comprises a spin transfer torque (STT) memory cell, spin orbit torque (SOT) memory cell, orthogonal spin transfer (OST) MRAM cell, or magnetoelectric RAM (MeRAM) cell.

4. The method of claim 1, wherein measuring the MAER for the set of storage memory cells comprises;
    writing a set of test data into the set of storage memory cells;
    thereafter reading the set of storage memory cells in reference to the first subset of reference memory cells stored with the set of reference data to obtain a read output; and
    comparing the set of test data with the read output to obtain the measured MAER as an percentage error.

5. The method of claim 4, wherein the first MAER threshold is above 1%.

6. The method of claim 1, wherein measuring the MAER for the set of storage memory cells comprises:
    writing logic ones into the set of storage memory cells and thereafter determining a logic one MAER by reading the set of storage memory cells in reference to the first subset of reference memory cells stored with the set of reference data;
    writing logic zeros into the set of storage memory cells and thereafter determining a logic zero MAER by reading the set of storage cells in reference to the first subset of reference memory cells stored with the set of reference data; and
    determining the measured MAER based on a combination of the logic one MAER and Logic zero MAER.

7. The method of claim 1, wherein the measured MAER is higher of a measured logic one MAER and a measured logic zero MAER, and the first MAER threshold is lower of a logic one MAER threshold and a logic zero MAER threshold for the first AI model.

8. The method of claim 1, wherein the first AI model comprises a convolutional neural network.

9. The method of claim 8, wherein the first MAER threshold comprises a percentage MAER and is above 1%.

10. The method of claim 1, wherein the pool of reference memory cells comprise a reference column, a reference row, or a reference array comprising multiple rows and multiple columns of memory cells.

11. The method of claim 1, wherein the set of reference data comprises approximately an equal number of random zeros and ones.

12. The method of claim 1, further comprising reusing the set of storage memory cells and the pool of reference memory cells for a second AI model.

13. The method of claim 12, further comprising:
    determining a second MAER threshold for the second AI model;
    determining whether the second MAER threshold is lower than the first MAER threshold;
    when the second MAER threshold is lower than the first MAER threshold:
        re-selecting another subset of reference memory cells from the pool of reference memory cells and another set of reference data that provide another measured MAER of the set of storage memory cells lower than the second MAER threshold; and
        loading the second AI model into set of storage memory cells and using the another subset of reference memory cells stored with the another set of reference data for operation of the second AI model.

14. The method of claim 1, wherein the first subset of reference memory cells and the second subset of reference memory cells of the pool of reference memory cells comprises at least one common reference memory cells.

15. The method of claim 1, wherein majority of the first subset of reference memory cells and the second subset of reference memory cells of the pool of reference memory cells are common reference memory cells.

16. An integrated circuit comprising:
    an artificial intelligence (AI) logic circuit for operating an AI model; and
    an embedded memory coupled to the AI logic circuit and connectable to an external processor, the embedded memory comprising:
    a set of storage memory cells;
    a pool of reference memory cells; and
    an interface circuit for connecting to the external processor to cause the external processor to execute a set of instructions to:
        automatically select from the pool of reference memory cells of the embedded memory a first subset of reference memory cells;
        write a set of reference data into the first subset of reference memory cells;
        measure a memory access error rate (MAER) for a set of storage memory cells of embedded memory in reference to the subset of reference memory cells stored with the set of reference data;
        determine a first MAER threshold for operating the AI model with an acceptable accuracy;
        determine whether the measured MAER is below the first MAER threshold;
        when the measured MAER is below the first MAER threshold, load the AI model into the set of storage memory cells and configure the subset of reference memory cells with the set of reference data for subsequent operation of the AI model; and
        when the measured MAER is not below the first MAER threshold, start a process for automatically selecting a second subset of reference memory cells from the pool of reference memory cells for use with the AI model.

17. The integrated circuit of claim 16, wherein the external processor, when executing the set of instructions to measure the MAER for the set of storage memory cells, is configured to:
    write a set of test data into the set of storage memory cells;
    thereafter read the set of storage memory cells in reference to the first subset of reference memory cells stored with the set of reference data to obtain a read output; and
    compare the set of test data with the read output to obtain the measured MAER as an percentage error.

18. The integrated circuit of claim 16, wherein the pool of reference memory cells and the set of storage memory cells of the embedded memory comprise magnetic random access memory (MRAM) cells.

19. The integrated circuit of claim 18, wherein each of the MRAM cells comprises a spin transfer torque (STT)

memory cell, spin orbit torque (SOT) memory cell, orthogonal spin transfer (OST) MRAM cell, or magnetoelectric RAM (MeRAM) cell.

20. The integrated circuit of claim 16, wherein the set of reference data comprises approximately an equal number of random zeros and ones.

* * * * *